(12) United States Patent
Guggilla et al.

(10) Patent No.: US 11,100,267 B1
(45) Date of Patent: Aug. 24, 2021

(54) MULTI DIMENSIONAL MEMORY COMPRESSION USING BYTEWIDE WRITE ENABLE

(71) Applicant: XILINX, INC., San Jose, CA (US)

(72) Inventors: Nithin Kumar Guggilla, Hyderabad (IN); Pradip Kar, San Jose, CA (US); Chaithanya Dudha, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/867,165

(22) Filed: May 5, 2020

(51) Int. Cl.
*G06F 30/337* (2020.01)
(52) U.S. Cl.
CPC ................ *G06F 30/337* (2020.01)
(58) Field of Classification Search
CPC .................................................. G06F 30/337
See application file for complete search history.

(56) References Cited

U.S. PATENT DOCUMENTS

| | | | |
|---|---|---|---|
| 6,820,182 B1* | 11/2004 | Bauman | G06F 11/2069 707/999.202 |
| 9,792,395 B1 | 10/2017 | Pvss et al. | |
| 2006/0090106 A1* | 4/2006 | Evans | G11C 29/48 714/718 |
| 2013/0093460 A1* | 4/2013 | Voogel | H03K 19/018585 326/38 |
| 2019/0188352 A1* | 6/2019 | Kim | G06F 30/327 |

* cited by examiner

*Primary Examiner* — Nghia M Doan
(74) *Attorney, Agent, or Firm* — Patterson + Sheridan, LLP (57) ABSTRACT

Embodiments herein describe techniques for designing a compressed hardware implementation of a user-designed memory. In one example, a user defines a memory in hardware description language (HDL) with a depth (D) and a width (W). To compress the memory, a synthesizer designs a core memory array representing the user-defined memory. Using addresses, the synthesizer can identify groups of nodes in the array that can be compressed into a memory element. The synthesizer designs input circuitry such as a data replicator and a write enable generator for generating the inputs and control signals for the groups. The synthesizer can then implement the design in an integrated circuit where each group of nodes maps to a single memory element, thereby resulting in a compressed design.

20 Claims, 6 Drawing Sheets

MULTI DIMENSIONAL MEMORY COMPRESSION USING BYTEWIDE WRITE ENABLE

TECHNICAL FIELD

Examples of the present disclosure generally relate to designing a compressed memory system based on a user-defined memory.

BACKGROUND integrated circuits can include different types of memory elements or blocks. These blocks may have different types of aspect ratios—i.e., different depths and bit widths. User can use these blocks to build user-defined memories to their custom specifications. That is, the integrated circuit can include different memory blocks that can be interconnected to form larger memory arrays to meet user specifications.

However, current techniques for converting user-designed memory into hardware implementations can lead to poor memory utilization. One cause of poor memory utilization is a mismatch between the dimensions of the user-designed memory and the aspect ratios of the physical memory elements on which the user-designed memory is implemented. For example, the user-designed memory may have a width dimension that is much smaller than the width of the memory elements, resulting in much of the memory elements not being used.

SUMMARY

Techniques for compressing a memory are described. One example is a method that includes designing, using one or more computer processors, a core memory array representing the memory where the core memory array includes a plurality of nodes, identifying groups of nodes in the core memory array that can be compressed into respective physical memory elements in an integrated circuit, generating input circuitry for the physical memory elements where the input circuitry includes a data replicator to replicate input data before the replicated data is transmitted to the physical memory elements and a write enable (WE) generator configured to output a bit mask for selecting a portion of the replicated data to be written into one of the physical memory elements, and generating output circuitry for the physical memory elements.

One example described herein is a computer readable medium containing computer program code that, when executed by one or more computer processors, performs an operation. The operation includes designing a core memory array representing a memory to be implemented in an integrated circuit where the core memory array includes a plurality of nodes, identifying groups of nodes in the core memory array that can be compressed into respective physical memory elements in the integrated circuit, generating input circuitry for the physical memory elements where the input circuitry includes a data replicator to replicate input data before the replicated data is transmitted to the physical memory elements and a write enable (WE) generator configured to output a bit mask for selecting a portion of the replicated data to be written into one of the physical memory elements, and generating output circuitry for the physical memory elements.

One example described herein is a computing system that includes a processor and memory comprising a program, which when executed by the processor, performs an operation. The operation includes designing a core memory array representing a memory to be implemented in an integrated circuit where the core memory array includes a plurality of nodes, identifying groups of nodes in the core memory array that can be compressed into respective physical memory elements in the integrated circuit, generating input circuitry for the physical memory elements where the input circuitry includes a data replicator to replicate input data before the replicated data is transmitted to the physical memory elements and a write enable (WE) generator configured to output a bit mask for selecting a portion of the replicated data to be written into one of the physical memory elements, and generating output circuitry for the physical memory elements.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for designing a compressed hardware implementation of a user-designed memory. In one example, a user defines a memory in hardware description language (HDL) or register transfer logic (RTL) with a depth (D) and a width (W). A synthesizer then maps the user-defined memory to one or more physical memory elements or blocks in an integrated circuit. For example, the synthesizer may divide the depth of the user defined memory (e.g., 32 k) by the depth of each memory element (e.g., 4 k) to determine the number of memory elements required to implement the user-defined memory in the IC (e.g., implementing a user-defined memory with a depth of 32 k requires eight 4 k memory elements). But this technique does not consider the width of the user-defined memory which may be much smaller than the width of the memory elements (e.g., 8 bits versus 64 bits) which means much of the memory elements may be unused.

Instead, the embodiments here describe techniques for compressing the user-defined memory. To do so, the synthesizer designs a core memory array representing the user-defined memory. Using addresses, the synthesizer can identify groups of nodes in the core memory array that can be compressed into one memory element. Once the groups are identified, the synthesizer designs input circuitry such as a data replicator and a write enable generator for generating the inputs and control signals for the groups. The synthesizer can then implement the design in an integrated circuit where each group of nodes maps to a single memory element. Because multiple nodes are mapped to a single physical memory element, memory utilization can be increased by adding only a small amount of input circuitry (e.g., the data replicator and the write enable generator).

Figure 1A:
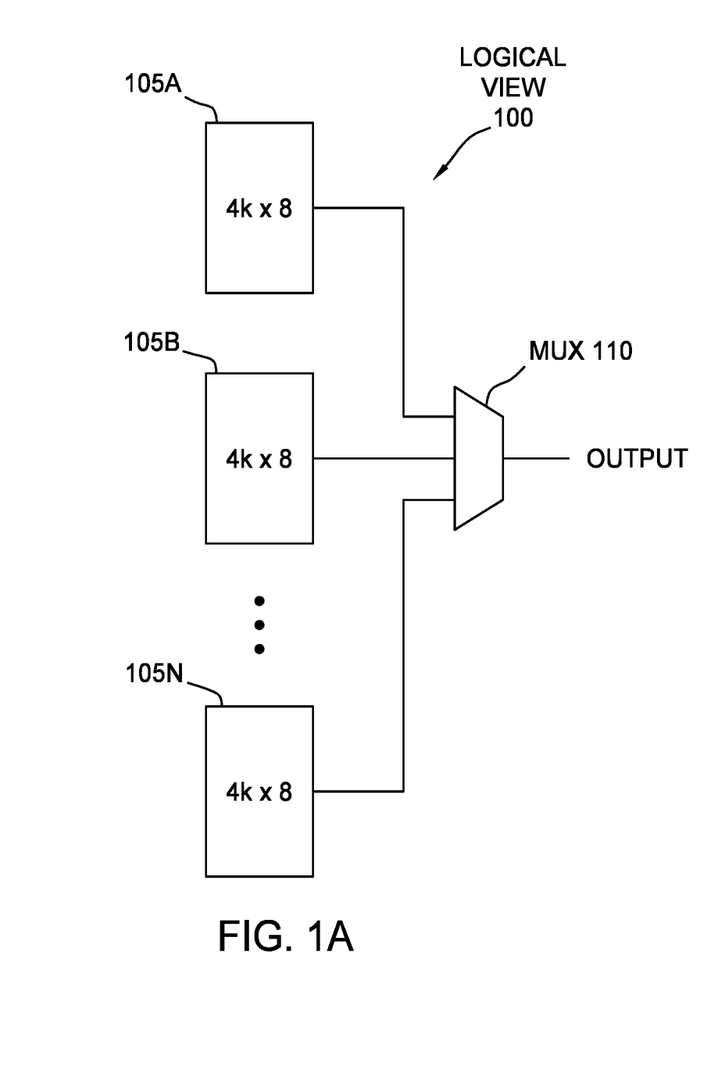
FIG. 1A illustrates a logical view of user-defined memory, according to an example.

FIG. 1A illustrates a logical view 100 of user-defined memory, according to an example. In this embodiment, the user-defined memory has a depth of 32 k and a width of 8 bits. That is, the memory has 32 k entries that each stores 8 bits of data (e.g., one byte). The logical view 100 illustrates how a user application views the memory, when implemented in an integrated circuit. In this case, the memory is implemented using eight memory elements 105 (105A-105N) that each have 4 k entries (e.g., a depth of 4 k) and a width of 8 bits. When writing to the memory elements 105, the most significant bits (MSB) in the address can be used to select one of the memory elements while the least significant bits (LSB) in the address can be used to select which entry an 8 bit/1 byte word of input data is written.

When reading from the memory elements 105, the LSB of the address can be sent to each of the memory elements 105 which they use to output a corresponding 8 bit entry to a multiplexer (mux) 110. The MSB of the address can then be used as the selector signal of the MUX to output the 8-bit word corresponding to the correct memory element 105. However, the logical view 100 does not account for the dimensions of the physical memory element that implement the user-defined memory. Large mismatches in the dimensions of the user-defined memory and the physical memory elements can result in poor memory utilization.

Figure 1B:
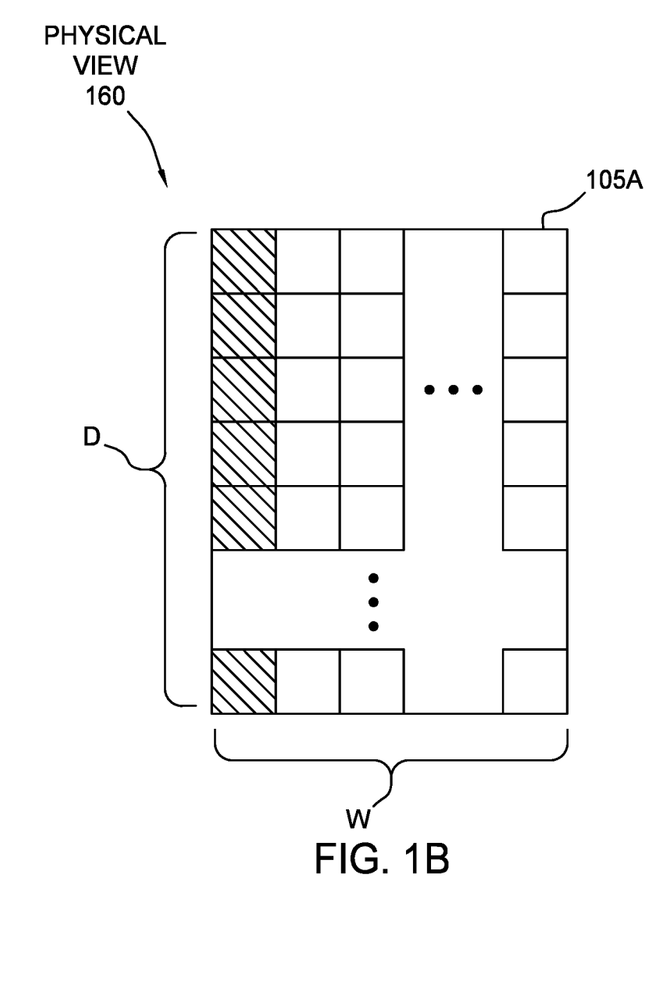
FIG. 1B illustrates a physical view of a memory element used in the user-defined memory in FIG. 1A, according to an example.

FIG. 1B illustrates a physical view 160 of a memory element 105A used in the memory in FIG. 1A, according to an example. That is, FIG. 1B illustrates what portion of the memory element 105A is used to implement a 4 k×8 block of memory as shown in FIG. 1A. In this example, the memory element 105A has a depth (D) of 4 k and can have any width (W) that is greater than 8 bits e.g., 16 bits, 32 bits, 64 bits, etc. Because the logical view 100 in FIG. 1A implements only a 4 k×8 memory in each of the memory elements 105, only the first column of the memory element 105A is used to store data for the user-defined memory, as illustrated by the shading. The remaining columns of entries in the memory element 105A are not used, as illustrated by not having any shading. For example, if each memory element 105 has a width of 64 bits, then implementing a 32 k×8 user-defined memory using eight 4 k×8 memory elements 105 (when these memory elements are 64 bits wide) results in a memory utilization of only 12.5% (memory utilization (%)=8/64*100). Thus, implementing the user-defined memory using the logical view 100 can result in poor memory utilization in the underlying physical memory elements.

Figure 2:
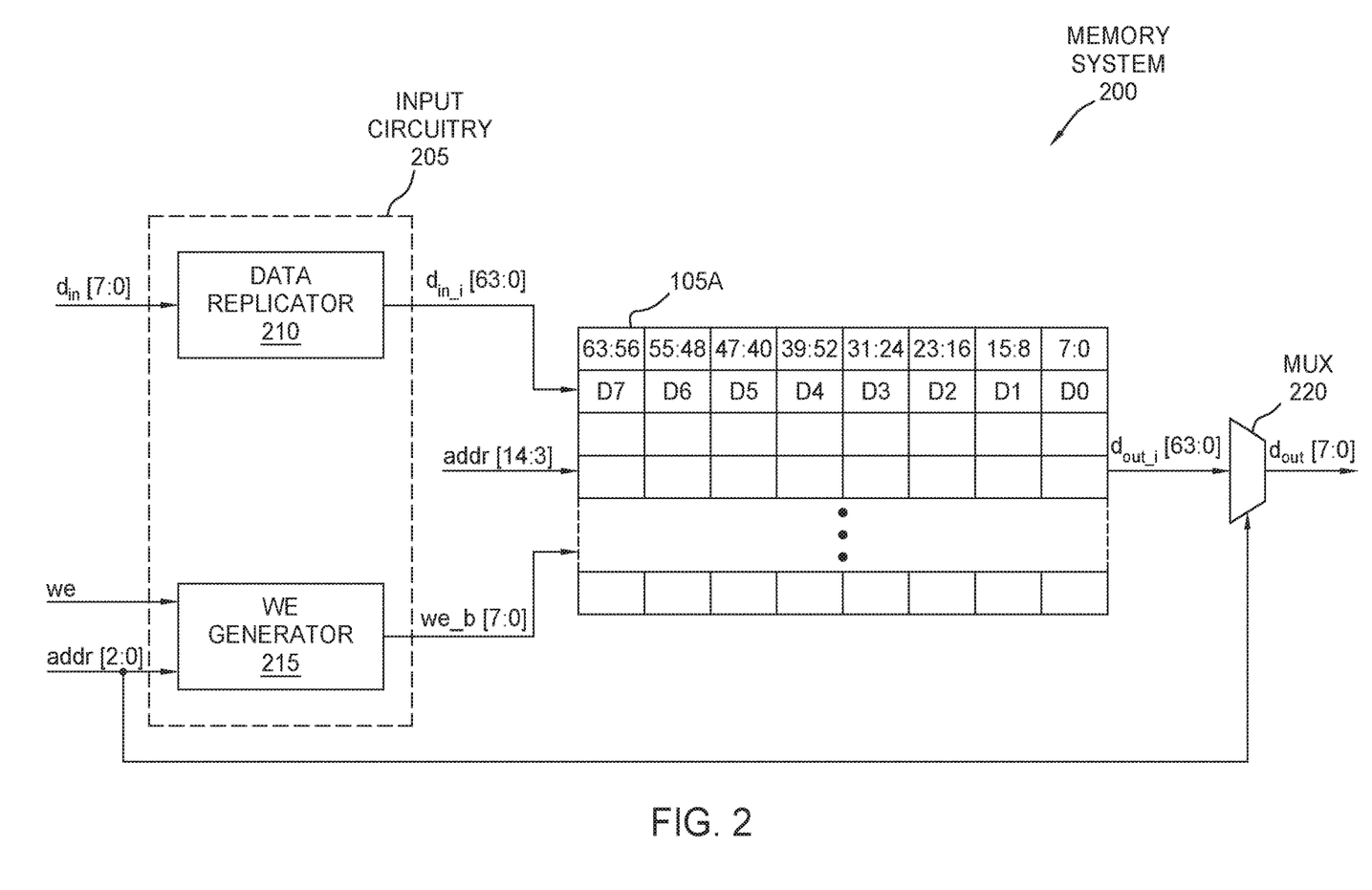
FIG. 2 illustrates a compressed hardware implementation of the user-defined memory in FIG. 1A, according to an example.

FIG. 2 illustrates a compressed hardware implementation of the user-defined memory in FIG. 1A, according to an example. The memory system 200 in FIG. 2 illustrates that the entries of the user-defined memory can be compressed into a single memory element 105A, rather than eight memory elements as shown in FIG. 1A. That is, a 32 k×8 user-defined memory can be implemented in an integrated circuit using one 4 k×64 memory element 105A. Generally, this is accomplished by using more columns in the physical memory element 105 than would be otherwise if the logical view 100 illustrated in FIG. 1A was directly mapped to the physical memory elements.

Also, the memory system 200 includes input circuitry 205 which may not be used in the logical view 100. The input circuitry 205 enables the memory system 200 to compress multiple memories into the single memory element 105k As shown, the input circuitry 205 includes a data replicator 210 and a write enable (WE) generator 215. The data replicator 210 receives the input byte that is to be stored in the memory element 105A—e.g., 8 bits in this example (din[7:0])—and replicates it to the number of bytes being used in each row of the memory element 105A. For example, in FIG. 2, eight columns each storing 8 bits or 1 byte are used in the memory element 105k Thus, the data replicator copies or replicates the 8-bit input data into a 64 bit word that includes eight copies of the 8-bit input data. By doing so the memory system 200 can store the 8-bit input data into any one of the eight columns labeled D7-D0.

The WE generator 215 receives an WE signal which indicates whether data is being written into the memory element 105A (e.g., the WE signal has a logical value of 1) or being read from the memory element 105A (e.g., the WE signal has a logical value of 0). The WE generator 215 also receives a portion of the LSBs of the address corresponding to the read/write request. The number of LSBs depends on the number of addressable bytes in each row of the memory element 105A. In this case, the memory system 200 receives an 8 bit input data that is written into one of the columns D7-D0. Thus, the WE generator uses the three LSBs of the address—i.e., addr[2:0]—to generate a bit mask signal (we_b[7:0]) indicating in which column the input data should be stored. For example, if the LSBs indicate the input data should be stored in column D0, the WE generator outputs a bit mask of "0000001". As a result, the 8-bit input data is written into an entry in column D0, but not in any of the other columns. Conversely, if the LSBs indicate the input data should be stored in column D1, the WE generator 215 outputs a bit mask of "00000010" which permits the 8-bit input data to be written into an entry in column D1, but not in any of the other columns. In this manner, although each of the columns D7-D0 receives the 8-bit input data because the data was replicated, the bit mask ensures the input data is written into an entry in only one of the columns.

While FIG. 2 illustrates using LSB of the address (along with the WE signal) to generate the bit mask, in another embodiment, MSBs of the address can be used instead. That is, the WE generator can be configured to accept the original WE signal along with either LSBs or MSBs of the address to generate the bit mask. Thus, stated generally, the WE generator can use a subportion of the address (either some number of the LSBs or MSBs of the address) to generate the bit mask. In one embodiment, the number of bits of the subportion is based on the compression factor (which is described below) of the memory—e.g., three LSBs or MSBs are used if the compression factor is eight.

The MSBs of the address are used to select a row of the memory element 105A in which the input data should be written. In this example, the MSBs are addr[14:3] which the memory element 105A can use to identify the row in which the input data should be written. The bit mask then ensures the input data is written into the correct addressable byte in the selected row as discussed above. In this manner, the input circuitry 205 permits the memory system 200 to compress multiple memories into a single physical memory element 105A. That is, the eight 4 k×8 memories illustrated in FIG. 1A can be compressed into the 4 k×64 memory element 105A in FIG. 2.

The LSBs used by the WE generator 215 to output the bit mask can also be used as selector signals of a mux 220 when reading data from the memory element 105A. For example, when receiving a read request, the MSBs of the read address can be used to select the correct row containing the desired data. The 64 bits (i.e., the 8 bytes) stored in that row are then output to the mux 220. Using the LSBs of the read address, the mux 220 selects the 8-bit value of one of the columns from the received 64 bits. In this manner, the LSBs of the address can be used to generate a bit mask for writing data into the correct columns as well as a selector signal for reading data out from the correct column.

In one embodiment, the input circuital 205 and the mux 220 permit the memory system 200 to write data into the memory element 105A and read that same data in the same read/write cycle. That is, some users may want the ability to read and write with a latency of one, where the data being written into the memory element 105A can also be read out from the memory element 105A in parallel. The logical view 100 in FIG. 1A supports such a feature, which is also possible to achieve using the physical memory system 200 in FIG. 2. Thus, when compressing the memory elements into a single memory element 105A, the memory system 200 can retain the ability to read and write in parallel, if desired by the user.

While FIG. 2 illustrates compressing eight logical memories into a single physical memory element 105A, this is just one example. The number of memories that can be compressed will depend on the dimensions of the user-defined memory as well as the aspect ratio of the physical memory elements. For example, if the user-defined memory was 32 k×16, then a compression ratio 4:1 can be achieved rather than the 8:1 compression ratio shown in FIG. 2. In that example, the user-defined memory could be implemented using two physical memory elements 105 rather than just one (assuming the same dimensions of 4 k×64). The following discussion describes techniques for compressing user-defined memories into physical memory implementations.

Figure 3:
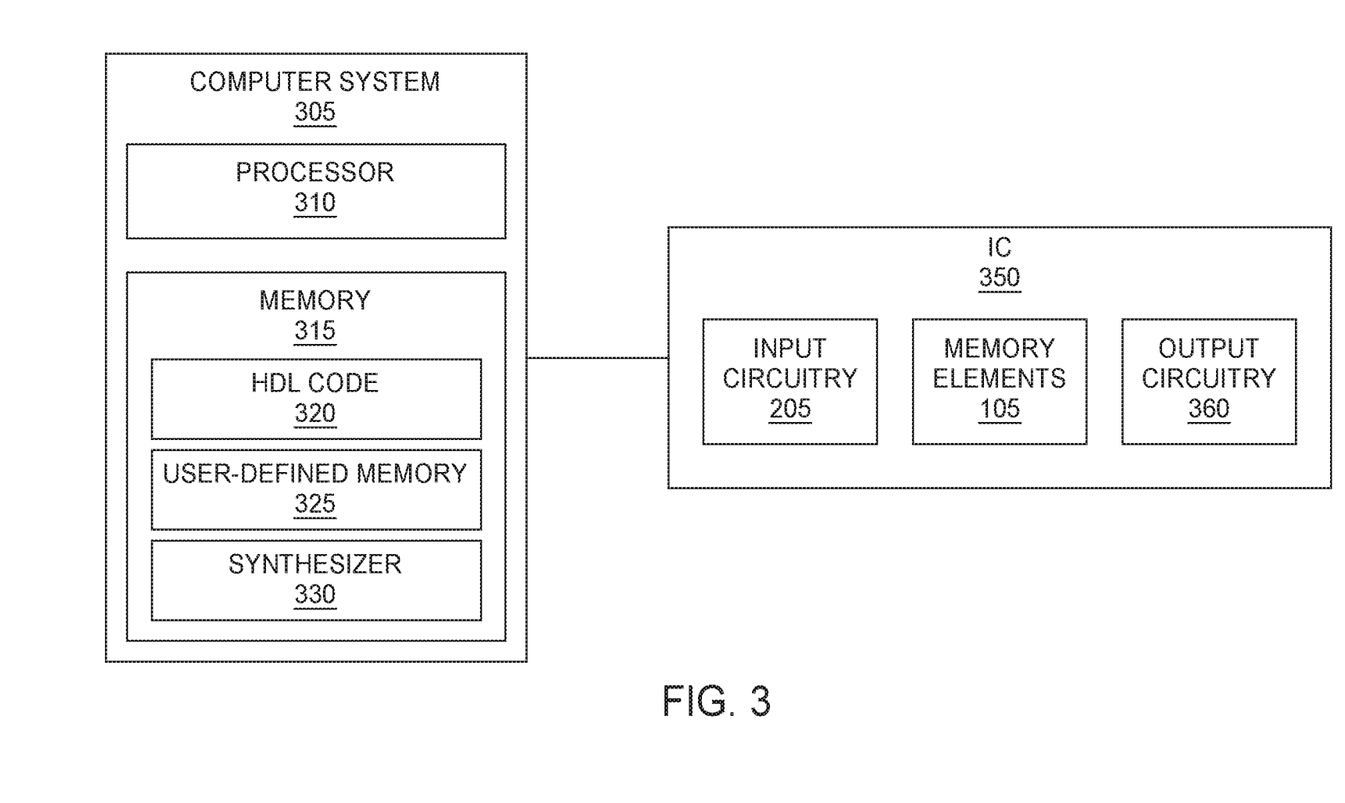
FIG. 3 is a block diagram of a computing system for implementing a user-defined memory in an integrated circuit, according to an example.

FIG. 3 is a block diagram of a computing system 305 for implementing a user-defined memory in an integrated circuit, according to an example. The computing system 305 includes a computer processor 310 and memory 315. The processor 310 represents any number of processing elements that each can include any number of processing cores. Further, the computing system 305 can one physical computing system (e.g., a server) or a plurality of communicatively coupled computing devices (e.g., computing elements in a data center). The memory 315 can include volatile memory elements, non-volatile memory elements, or a combination of both.

The memory 315 includes HDL code 320 that includes a user-defined memory 325. For example, the HDL code 320 may be written by the user in order to configure an integrated circuit (IC) 350 to perform a task. As part of the task, the HDL code 320 includes a user-defined memory 325 that defines a depth and width of a memory to be implemented in the IC 350. In one embodiment, the user may write the HDL code 320, but in other embodiments, the user may write high-level program code which a compiler then compiles to generate the HDL code 320. While the HDL code 320 is shown containing only the user-defined memory 325, the code 320 can contain other different constructs that can be used to configure the IC 350 to perform one or more tasks.

The memory 315 also includes a synthesizer 330 (e.g., a software application) which converts the HDL code 320 (and the user-defined memory 325) into instructions that can configure the IC 350. In one embodiment, the synthesizer 330 generates a bit stream that the computing system 305 transmits to the IC 350. The bit stream can be used to program logic in the IC 350. In the embodiments below, the synthesizer 330 determines whether it can compress the user-defined memory according to the dimensions of the user-defined memory 325 and the aspect ratio of the memory elements 105 in the IC 350.

The IC 350 can be any semiconductor chip that has memory elements 105 with a fixed aspect ratio. While the embodiments herein discuss using the synthesizer 330 to compress the user-defined memory 325 so the memory 325 can be implemented in a IC 350 that is already fabricated, the embodiments herein can also be used when designing an application specific integrated circuit (ASIC). Although in that situation the memory in the IC 350 (e.g., an ASIC) could be custom made to match the dimensions of the user-defined memory 325, it may be more efficient or cost effective to design memory elements with aspect ratios that differ from the dimensions of the user-defined memory 325. In that example, the techniques could be used to design the IC so that the memory elements are efficiently used.

In one embodiment, the IC 350 includes at least some programmable logic. For example, the synthesizer 330 may generate instructions (e.g., a bit stream) for configuring the programmable logic. In one embodiment, the input circuitry 205 and the output circuitry 360 may be formed from programmable logic; but this not a requirement. In other examples, the input circuitry 205 and output circuitry 360 may be selectable hardened circuitry which is selected according to the instructions generated by the synthesizer 330.

In one embodiment, the IC 350 is a field programmable gate array (FPGA) that include programmable logic blocks and memory blocks (e.g., the memory elements 105). In another embodiment, the IC 350 is a system of a chip (SoC) that include programmable logic and hardened blocks (e.g., a programmable logic array as well as data processing engines and a network on a chip).

Using the instructions generated by the synthesizer 330, the IC 350 can implement the user-defined memory 325. More specifically, the IC 350 can include a compressed version of the user-defined memory 325 relative to the logical view shown in FIG. 1A. To implement the compressed memory, the synthesizer 330 also configures the input circuitry 205 (e.g., a data replicator and WE generator)

and the output circuitry 360 (e.g., one or muxes that use LSBs of the read/write addresses as selector signals).

Figure 4:
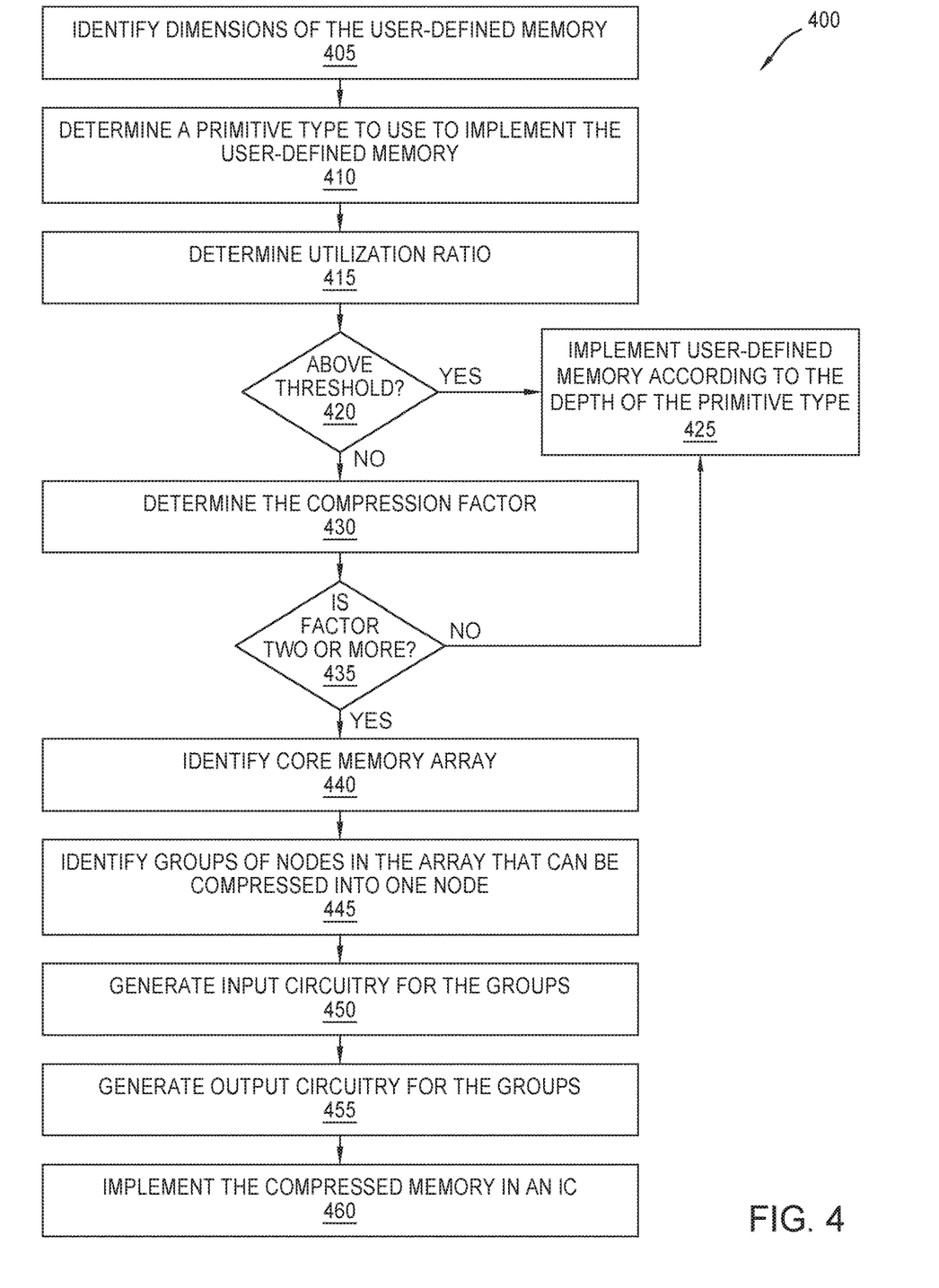
FIG. 4 is a flowchart for designing a compressed user-designed memory, according to an example.

FIG. 4 is a flowchart of a method 400 for designing a compressed user-designed memory, according to an example. At block 405, the synthesizer identifies dimensions of a user-defined memory. That is, the synthesizer can evaluate HDL code (e.g., RTL) that includes one or more user-defined memories that are used in order to configure or produce an IC (e.g., an ASIC, FPGA, SoC, etc), to perform a task. For example, the user-defined memory have be defined by a depth and width dimension. In one embodiment, the HDL code may define the depth of the user-defined memory by an address width (e.g., the number of bits used to address the entries in the memories). The HDL code may also define a data width and a byte width of the user-defined memory.

At block 410, the synthesizer determines a primitive type to use to implement the user-defined memory in the IC. In one embodiment, an IC includes different types of memory primitive types (e.g., multiple types of random access memory (RAM)). These different primitive types can have different aspect ratios (e.g., 16 k×2, 32 k×1, 8 k×4, 4 k×8, 4 k×72, 4 k×8, 2 k×16, 1 k×32, etc.). The primitive types may have other different features which determines which primitive type is selected to implement the user-defined memory. In one embodiment, the user selects which primitive type to use. In other embodiments, the synthesizer selects the primitive type to use. Further still, the IC may have only one type of primitive (e.g., the same memory elements or blocks), in which case block 410 may be omitted.

At block 415, the synthesizer determines a utilization ratio assuming the user-defined memory was implemented using the selected primitive type without compressing the user-defined memory. That is, the synthesizer may determine the utilization ratio when the user-defined memory is implemented as shown in FIGS. 1A-1B. In that example, the utilization of the memory elements (e.g. the selected memory primitive) was 12.5% assuming the memory elements had a width of 64 bits. Put differently, the synthesizer may determine the utilization ratio of the memory if were implemented using a simple method where multiple memories in the user-defined memory are not compressed into the same physical memory element.

At block 420, the synthesizer determines whether the utilization ratio is above a threshold. In one embodiment, the user may specify a utilization ratio threshold for determining when to compress a user-defined memory and when to implement the memory using standard techniques. This represents a tradeoff in having to add the additional input and output circuitry for the compressed memory (as well as the time used by the synthesizer to compress the memory) versus implementing the memory using a standard technique where the memory is not compressed (but the additional input and output circuitry are not needed).

If the utilization ratio exceeds the threshold, the method 400 proceeds to block 425 where the synthesizer implements the user-defined memory according to the depth of the selected primitive type. For example, if the user-defined memory has a depth of 32 k and the primitive (e.g., the memory elements or blocks) has a depth of 16 k, then four primitives (e.g., four memory elements) are used to implement the user-defined memory (assuming the data width of the memory elements are equal to or greater than the data width of the user-defined memory).

However, if the memory utilization is less than the threshold (e.g., the memory utilization is 50% but the threshold is 75%), the method 400 proceeds to block 430 where the synthesizer determines the compression factor that can be achieved. In one embodiment, the compression factor is the maximum data width of the selected primitive/memory element divided by the data width of the user-defined memory. For example, if the data width of the primitive/memory element is 72 bits and the data width of the user-defined memory is 18 bits, the compression factor is four. This means, as discussed below, that the synthesizer can compress the user-defined memory so that four times less physical memory is used to implement the memory when compared to the process used at block 425.

A compression factor of two or more means that the synthesizer can compress at least two memory nodes into one single physical memory element or primitive. In one embodiment, a compression factor of less than two means that there is no, or lithe benefit to compressing the user-defined memory. Thus, if the compression factor is less than two, the method proceeds to block 425 to implement the memory using that process. Thus, even though the utilization ratio is below the threshold, because the compression factor is also less than two, there may be little to no benefit to compress the memory. Stated differently, the synthesizer may be unable to compress the memory, and thus, uses the technique in block 425 to implement the memory in the IC.

However, assuming the compression factor is two or more, the method 400 proceeds to block 440 where the synthesizer identifies a core memory array representing the user-defined memory.

Figure 5:
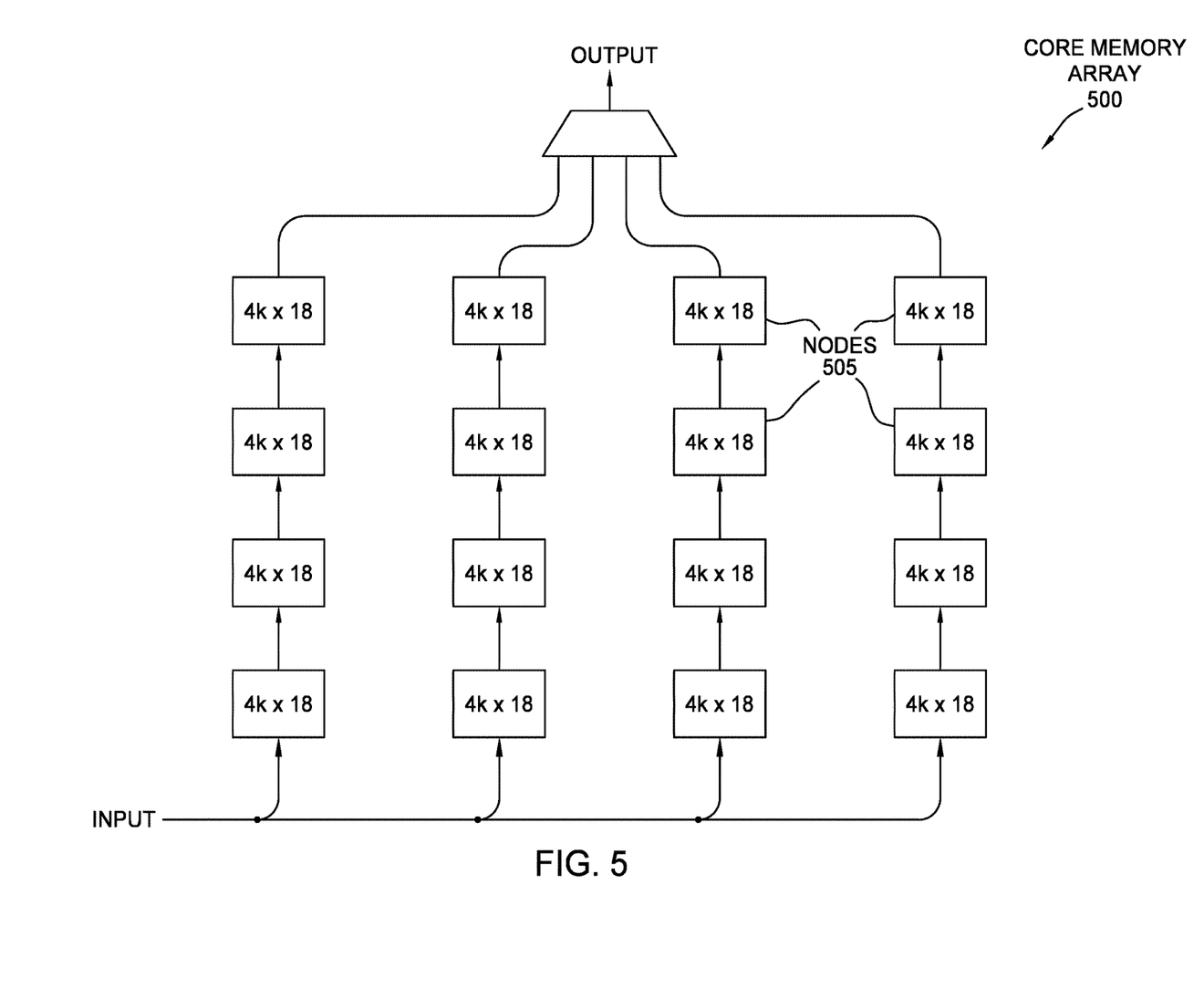
FIG. 5 illustrates a core memory array for a user-defined memory according to examples.

FIG. 5 illustrates a core memory array 500 for a user-defined memory, according to examples. The synthesizer can use any number of techniques to generate the core memory array. In this embodiment, core memory array 500 comprises a plurality of nodes 505. In one embodiment, each of the nodes 505 corresponds to a section of the user-defined memory. For example, each of the nodes 505 in FIG. 5 represents a 4 k×18 section of the user-defined memory. As mentioned above, if these nodes 505 were directly mapped (one-to-one) to a physical primitive or memory element, many of the entries in the primitive may be unused. By compressing the core memory array 500 as discussed in method 400, the utilization ratio of the primitives can be increased.

Returning to the method 400, at block 445 the synthesizer identifies groups of nodes in the core memory array that can be compressed into one node. That is, the synthesizer determines how many, and which ones, of the nodes in the core memory array can be implemented using the same physical primitive/memory element. In one embodiment, the ground are identified by analyzing input addressing circuitry of the memory nodes. For example, the memory nodes may form a group address sequential/consecutive address space, so that groups can be formed by selecting CF consecutive memory blocks starting from the beginning of the address range for the user-defined memory. In one embodiment, the number of sections of the user-defined memory that are compressed into a single primitive is equal to the compression factor.

At block 450, synthesizer generates (or designs) input circuitry for the groups. In one embodiment, the synthesizer generates a data replicator and a WE generator for the groups of nodes. If clustering the nodes into groups is done optimally, the groups can share the same WE signals.

At block 455, the synthesizer generates (or designs) output circuitry for the groups. For example, the synthesizer can select a multiplexer that is connected to the output of each group of nodes (or the output of each physical memory element).

Figure 6:
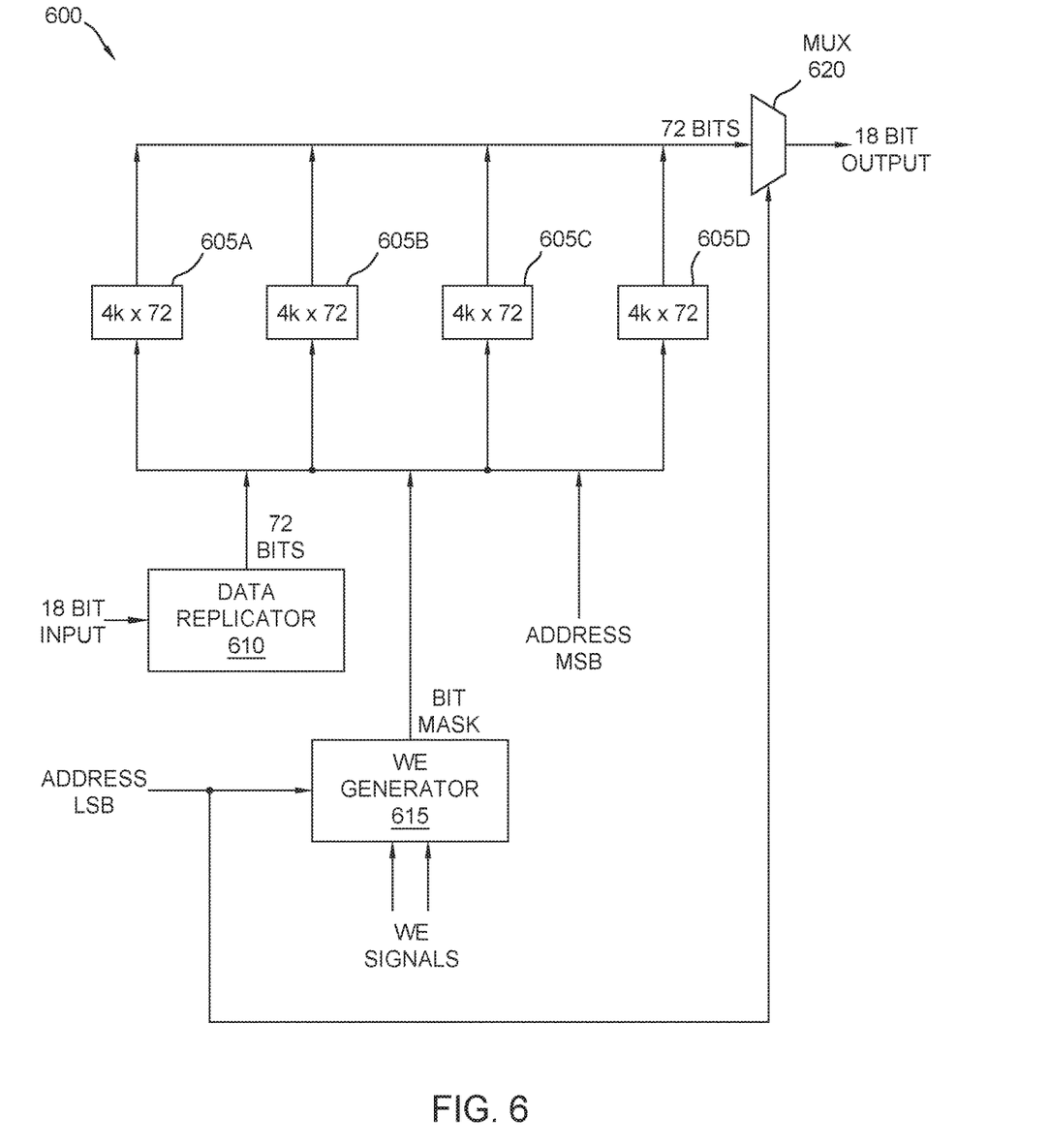
FIG. 6 illustrates a compressed memory system for a user-defined memory, according to examples.

FIG. 6 illustrates a compressed memory system 600 for a user-defined memory, according to examples. The compressed memory system 600 represents the result of performing blocks 440-455 of the method 400 where the core memory array 500 in FIG. 5 representing the user-defined memory is compressed into the memory system 600.

Instead of the 16 nodes 505 in FIG. 5, the synthesizer has grouped the nodes into four memory elements 605A-D. That is, four of the 4 k×18 nodes 505 in FIG. 5 are compressed into a single 4 k×72 memory element 605. Thus, the compressed memory system 600 has a compression factor of four.

To compress the nodes into the memory elements 605, the system 600 includes a data replicator 610 and a WE generator 615. Similar to discussed above, the data replicator receives 18 bits of input which it then replicates or copies into 72 bits which is sent to all four of the memory elements 605. The MSB of the address when doing a write is then used to select which one of the memory elements 605 is the destination memory element for the write request. The MSBs can also be used to identify the row of the selected memory element 605.

In this example, the memory is a two byte memory (where each byte is 9 bits) and the memory system 600 can write two bytes (or read two bytes) with each mite request. As such, the system 600 has two WE signals which are then sent to the WE generator 615. Using these WE signals and the LSBs of the address, the WE generator generates a bit mask that is sent to the memory elements 605. The bit mask is then used by the selected memory element 605 (which was selected using the MSBs of the address) to select which column(s) the 18 bit input is written. That is, although 72 bits are transmitted to the selected memory element 605, the bit mask ensures only 18 bits are written into the appropriate column(s) of the memory element 605. In this manner, the compressed memory system 600 can perform the same write functions as an uncompressed memory system with the addition of the input circuitry—i.e., the data replicator 610 and the WE generator 615.

The memory system 600 also includes a mux 620 that receives the outputs of the memory elements 605. That is, when executing a read request, the MSBs of the address can be used to select a particular row from a particular one of the memory elements 605. In this example, the selected memory element 605 outputs a 72 bit response to the write request to the mux 620 which contains all the data stored in the selected row. The LSBs of the write address are used as selector signals for the mux 620 to select the appropriate two bytes (e.g., 18 bits output) of the 72 bits received at the mux 620. As shown, the same LSBs sent to the WE generator 615 can also be used as the selector signals for the mux 620.

Returning to the method 400, at block 460 the synthesizer implements the compressed memory in an IC. That is, the circuitry illustrated in FIG. 6 can be used to configure or design an IC. In one embodiment, the synthesizer may generate a bit stream that includes the configuration information for configuring an IC to include the memory system 600 illustrated in FIG. 6. In one embodiment, some of the circuitry in FIG. 6 may be implemented in programmable logic, such as the data replicator 610 and the WE generator 615 although this is not a requirement. In another embodiment, the design generated by the synthesizer can be used to form an ASIC.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for compressing a memory defined in a hardware description language (HDL), the method comprising:
designing, using one or more computer processors executing a software synthesizer, a core memory array representing the memory, the core memory array comprising a plurality of nodes;
identifying, by the synthesizer, groups of nodes in the core memory array that can be compressed into respective physical memory elements in an integrated circuit;
generating input circuitry for the physical memory elements, the input circuitry comprising a data replicator to replicate input data before the replicated data is transmitted to the physical memory elements and a write enable (WE) generator configured to output a bit mask for selecting a portion of the replicated data to be written into one of the physical memory elements; and
generating output circuitry for the physical memory elements.

2. The method of claim 1, wherein each of the physical memory elements comprises a data width that is at least twice as large as a data width of each of the plurality of nodes.

3. The method of claim 2, wherein a depth of the memory is larger than a depth of each of the physical memory elements.

4. The method of claim 1, further comprising:
implementing the memory in the integrated circuit by connecting the input circuitry and the output circuitry to the physical memory elements in the integrated circuit.

5. The method of claim 4, further comprising:
configuring programmable logic in the integrated circuit to implement the input circuitry and the output circuitry.

6. The method of claim 1, wherein the WE generator receives at least one WE signal and a subportion of a write address in order to generate the bit mask, wherein a number of bits in the subportion depends on a compression factor corresponding to the memory.

7. The method of claim 6, wherein the output circuitry comprises a multiplexer coupled to each of the physical memory elements, wherein the bits in the subportion are used as a selector signal of the multiplexer.

8. The method of claim 1, further comprising:
determining a compression factor by comparing a data width of the plurality of nodes to a data width of the physical memory elements, wherein identifying the groups of nodes is performed when the compression factor is greater than or equal to two, and wherein the memory is not compressed when the compression factor is less than two.

9. A computer readable medium containing computer program code that, when executed by one or more computer processors, performs an operation, the operation comprising:
designing, using a software synthesizer, a core memory array representing a memory to be implemented in an integrated circuit, the core memory array comprising a plurality of nodes, and wherein the memory is defined in an HDL;
identifying, using the software synthesizer, groups of nodes in the core memory array that can be compressed into respective physical memory elements in the integrated circuit;

generating input circuitry for the physical memory elements, the input circuitry comprising a data replicator to replicate input data before the replicated data is transmitted to the physical memory elements and a write enable (WE) generator configured to output a bit mask for selecting a portion of the replicated data to be written into one of the physical memory elements; and generating output circuitry for the physical memory elements.

10. The computer readable medium of claim 9, wherein the physical memory elements comprise a data width that is at least twice as large as a data width of the plurality of nodes, and wherein a depth of the memory is larger than a depth of each of the physical memory elements.

11. The computer readable medium of claim 9, wherein the operation further comprises:

implementing the memory in the integrated circuit by connecting the input circuitry and the output circuitry to the physical memory elements in the integrated circuit.

12. The computer readable medium of claim 11, wherein the operation further comprises:

configuring programmable logic in the integrated circuit to implement the input circuitry and the output circuitry.

13. The computer readable medium of claim 9, wherein the WE generator receives at least one WE signal and a subportion of a write address in order to generate the bit mask, wherein a number of bits in the subportion depends on a compression factor corresponding to the memory.

14. The computer readable medium of claim 13, wherein the output circuitry comprises a multiplexer coupled to each of the physical memory elements, wherein the bits in the subportion are used as a selector signal of the multiplexer.

15. The computer readable medium of claim 9, wherein the operation further comprises:

determining a compression factor by comparing a data width of the plurality of nodes to a data width of the physical memory elements, wherein identifying the groups of nodes is performed when the compression factor is greater than or equal to two, and wherein the memory is not compressed when the compression factor is less than two.

16. A computing system, comprising:

a processor; and a memory comprising a program, which when executed by the processor, performs an operation, the operation comprising:

designing, using a software synthesizer, a core memory array representing the a user-defined memory, the core memory array comprising a plurality of nodes, wherein the user-defined memory is defined in an HDL;

identifying, using the software synthesizer, groups of nodes in the core memory array that can be compressed into respective physical memory elements in an integrated circuit;

generating input circuitry for the physical memory elements, the input circuitry comprising a data replicator to replicate input data before the replicated data is transmitted to the physical memory elements and a write enable (WE) generator configured to output a bit mask for selecting a portion of the replicated data to be written into one of the physical memory elements; and generating output circuitry for the physical memory elements.

17. The computing system of claim 16, wherein the physical memory elements comprise a data width that is at least twice as large as a data width of the plurality of nodes, and wherein a depth of the user-defined memory is larger than a depth of each of the physical memory elements.

18. The computing system of claim 16, wherein the operation further comprises:

implementing the user-defined memory in the integrated circuit by connecting the input circuitry and the output circuitry to the physical memory elements in the integrated circuit; and configuring programmable logic in the integrated circuit to implement the input circuitry and the output circuitry.

19. The computing system of claim 16, wherein the WE generator receives at least one WE signal and a subportion of a write address in order to generate the bit mask, wherein a number of bits in the subportion depends on a compression factor corresponding to the memory.

20. The computing system of claim 19, wherein the output circuitry comprises a multiplexer coupled to each of the physical memory elements, wherein the bits in the subportion are used as a selector signal of the multiplexer.

* * * * *

UNITED STATES PATENT AND TRADEMARK OFFICE
CERTIFICATE OF CORRECTION

PATENT NO. : 11,100,267 B1  
APPLICATION NO. : 16/867165  
DATED : August 24, 2021  
INVENTOR(S) : Nithin Kumar Guggilla, Pradip Kar and Chaithanya Dudha Page 1 of 1

It is certified that error appears in the above-identified patent and that said Letters Patent is hereby corrected as shown below:

In the Claims

Column 14, Line 2, in Claim 16, delete "the a" and insert -- the --, therefor.

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*